United States Patent [19]

Koshino et al.

[11] Patent Number: 4,780,426

[45] Date of Patent: Oct. 25, 1988

[54] METHOD FOR MANUFACTURING HIGH-BREAKDOWN VOLTAGE SEMICONDUCTOR DEVICE

[75] Inventors: Yutaka Koshino; Yoshiro Baba, both of Yokohama; Jiro Ohshima, Kawasaki, all of Japan

[73] Assignee: Kabushiki Kaisha Toshiba, Kawasaki, Japan

[21] Appl. No.: 101,026

[22] Filed: Sep. 24, 1987

[30] Foreign Application Priority Data

Oct. 7, 1986 [JP] Japan ................................ 61-238388

[51] Int. Cl.$^4$ .................... H01L 21/385; H01L 21/425
[52] U.S. Cl. ...................................... 437/31; 437/147; 437/151
[58] Field of Search ............................ 437/31, 151, 147

[56] References Cited

U.S. PATENT DOCUMENTS

| | | | |
|---|---|---|---|
| 3,833,429 | 9/1974 | Momma et al. | 437/151 X |
| 3,834,953 | 9/1974 | Nakamura et al. | 437/151 X |
| 3,895,976 | 7/1975 | Dumas | 437/147 |
| 4,060,427 | 11/1977 | Barile et al. | 437/147 X |
| 4,351,894 | 9/1982 | Yonezawa et al. | 437/147 X |
| 4,426,234 | 1/1984 | Ohshima et al. | 437/147 X |

FOREIGN PATENT DOCUMENTS 124427 8/1982 Japan .
31519 2/1983 Japan .

OTHER PUBLICATIONS

Temple, "Junction Termination Extension (JTE), A New Technique for Increasing Avalanche Breakdown Voltage and Controlling Surface Electric Fields in P-N Junctions," IEDM 77, pp. 423-426.
Selim, "High-Voltage, Large-Area Planar Devices," IEEE Electron Device Letters, vol. EDL-2, No. 9, pp. 219+221, Sep. 1981.

Primary Examiner—George T. Ozaki
Attorney, Agent, or Firm—Finnegan, Henderson, Farabow, Garrett and Dunner

[57] ABSTRACT

A first silicon oxide film is formed on the major surface of an n-type silicon substrate. A silicon nitride film is formed on the first silicon oxide film. The first silicon oxide film and the silicon nitride film are selectively etched to form an opening. Boron ions are implanted into the silicon substrate using the first silicon oxide film and the silicon nitride film as a mask. A second silicon oxide film is formed on the silicon substrate exposed by the opening. Gallium ions are implanted into the second silicon oxide film using the silicon nitride film as a mask. Boron and gallium ions are simultaneously diffused in the silicon substrate. In this case, a diffusion rate of gallium in the silicon substrate is higher than that of boron in the silicon substrate, and the diffusion rate of gallium in the silicon oxide film is higher than that in the silicon substrate. Therefore, a p-type second layer is formed in the substrate to surround a p$^+$-type first layer in a self-aligned manner.

11 Claims, 4 Drawing Sheets

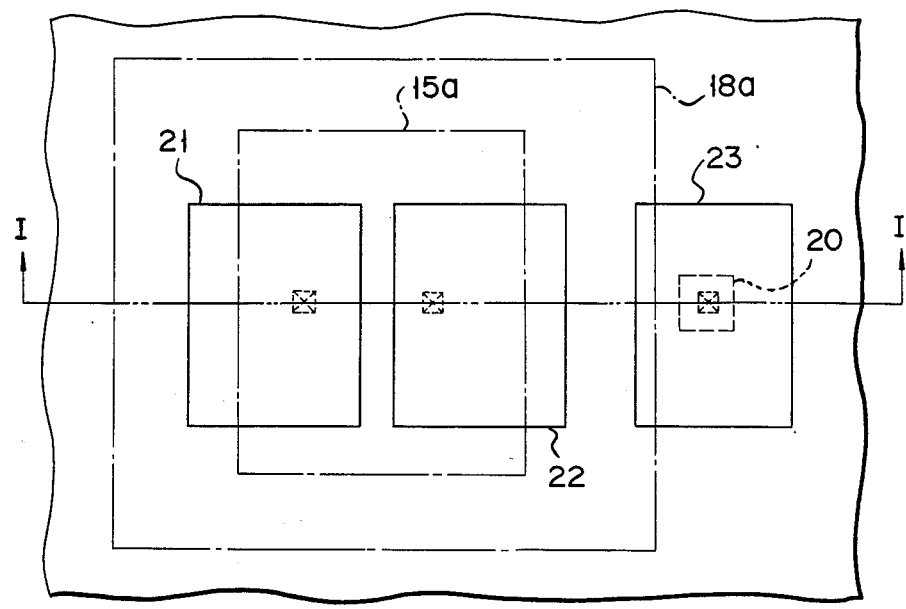
F I G. 2
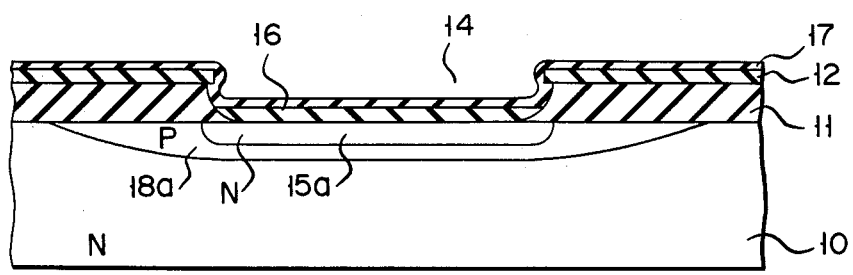
F I G. 5

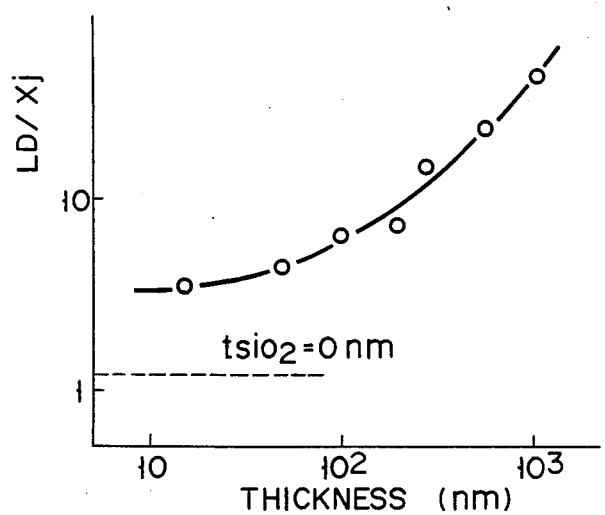
F I G. 3
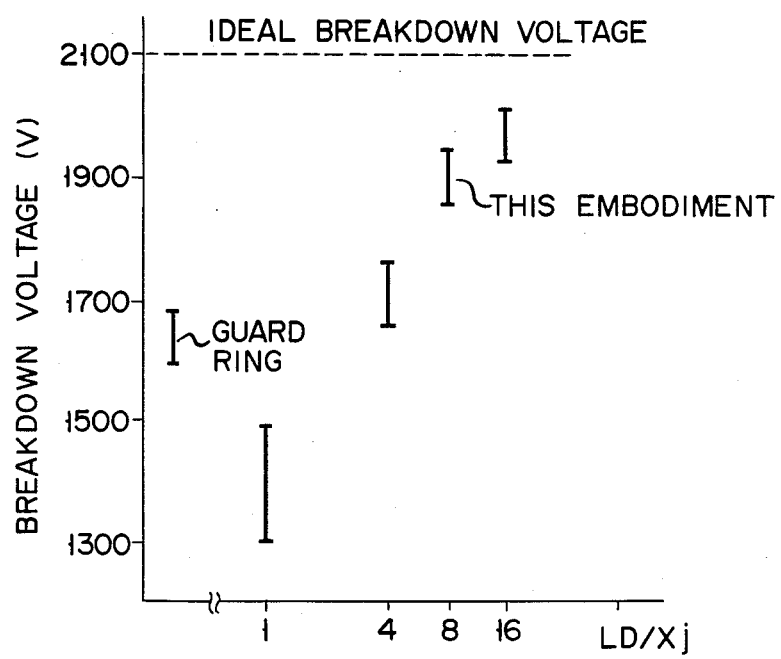
F I G. 4

METHOD FOR MANUFACTURING HIGH-BREAKDOWN VOLTAGE SEMICONDUCTOR DEVICE

BACKGROUND OF THE INVENTION

The present invention relates to a method for manufacturing a semiconductor device and, more particularly, to a method for manufacturing a high-breakdown voltage semiconductor device.

In order to improve a breakdown voltage of, e.g., a power transistor, various improvements have been proposed. For example, a structure is proposed wherein an electric field is prevented from being locally increased in a base region, an electric field in the base region is averaged, and an electric field is widened. In such a structure, a guard ring method is normally employed. An RFP (Resistive Field Plate) method, a JTE (Junction Termination Extension) method, and the like have been studied, and have been applied to some mass-production techniques.

The RFP method is described in literature entitled "High-Voltage Large Area Planar Devices" IEEE, Electron Device Letters, EDL-2, September 1981, No. 9, pp. 219-221. The JTE method is described in literature entitled "Junction Termination Extension (JTE), A New Technique For Increasing Avalanche Breakdown Voltage and Controlling Surface Electric Fields In P-N Junctions" IEDM, 77, pp. 423-426.

However, in an element employing the guard ring method, an electric field is concentrated on a curvature portion of a base-collector junction portion of a transistor and a junction curvature portion of a guard ring portion surrounding it. For this reason, in order to obtain a high-breakdown voltage element, the number of guard rings must be increased. However, if the number of guard rings is increased, the effective element area that can be used may be decreased. In the RFP method, a problem of "concentration of an electric field on the base region" as the drawback of the guard ring method is decreased. However, a leakage current level of a device is higher than that in the guard ring method, and a breakdown voltage of only about 70% of an ideal one can be obtained.

In the JTE method, an photoetching process and an impurity diffusion process are repeatedly performed in addition to manufacturing processes of the base region, so that a low-concentration layer is formed on a wide range around the base region, thus forming a base-collector junction portion having a large curvature. In the JTE method, a breakdown voltage 90% or higher of an ideal one can be obtained. However, in order to obtain a junction portion having a large curvature, the photoetching and impurity diffusion processes must be repeatedly performed. For this reason, the manufacturing processes become complex. In addition, breakdown voltages of manufactured semiconductor devices vary due to mask misalignment during the manufacturing processes.

SUMMARY OF THE INVENTION

It is an object of the present invention to provide a method for manufacturing a semiconductor device, with which a high-breakdown voltage semiconductor device can be obtained by simple processes.

In order to achieve the above object, the method for manufacturing a semiconductor device comprises:

the step of forming a first silicon oxide film (11) on a major surface of a silicon substrate (10) of a first conductivity type;

the step of selectively etching the first silicon oxide film (11) to form an opening (14);

the step of forming a second silicon oxide film (16) on the silicon substrate (10) exposed through the opening (14);

the step, performed at least one of before and after the step of forming the second silicon oxide film, of doping a first impurity in a portion of the silicon substrate (10) opposing the opening (14) using the first silicon oxide film (11) as a mask;

the step of doping, into the second silicon oxide film (16), a second impurity of a second conductivity type, a diffusion rate of which in the silicon substrate (10) is higher than that of the first impurity in the silicon substrate (10), and a diffusion rate of which in the first silicon oxide film (11) is higher than that in the silicon substrate (10); and the step of diffusing the first impurity and the second impurity of the second conductivity type into the silicon substrate at the same time to form, in the silicon substrate, a first layer and a second layer of the second conductivity type surrounding the first layer.

According to the method for manufacturing the semiconductor device according to the present invention with the above structure, the second layer can be formed to be self-aligned with the first layer. The curvature of the second layer can be desirably set (1 to 50 degrees) in accordance with the thickness of the second silicon oxide film. For this reason, if the first layer is of p conductivity type and the second layer is of low-concentration p conductivity type, a high-breakdown voltage npn transistor can be manufactured like in the JTE method. The manufacturing method of the present invention requires only two ion-implantation processes and a single ion-diffusion process. Thus, the manufacturing processes are simpler and the yield is higher as compared to the guard ring and JTE methods.

BRIEF DESCRIPTION OF THE DRAWINGS

FIG. 2 is a plan view of a semiconductor device shown in FIG. 1F;

FIG. 3 is a graph showing the relationship between a thickness of a second oxide film and a lateral diffusion ratio of a second layer in the method for manufacturing the semiconductor device according to the embodiment;

FIG. 4 is a graph for comparing a breakdown voltage of the semiconductor device manufactured by the method of the present invention with that of a semiconductor device manufactured by the guard ring method; and FIG. 5 is a sectional view showing the structure of a semiconductor device manufactured in accordance with another embodiment of the present invention.

DETAILED DESCRIPTION OF THE PREFERRED EMBODIMENTS

A method for manufacturing an npn transistor according to an embodiment of the present invention will now be described with reference to FIGS. 1A to 1F.

Figure 1A:
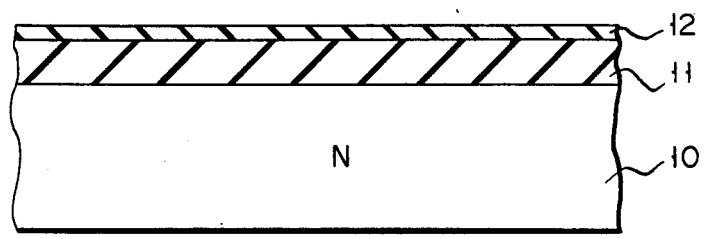
FIGS. 1A to 1F are sectional views of a semiconductor device for explaining a method for manufacturing a semiconductor device according to an embodiment of the present invention.

(1) First silicon oxide (SiO$_2$) film 11 is formed on the major surface of n-type silicon substrate 10 to have a thickness of about 1.2 μm. Silicon nitride (Si$_3$N$_4$) film 12 of a thickness of about 100 nm is deposited on silicon oxide film 11 by the LP-CVD method. Note that a diffusion rate (speed) of gallium, used for impurity layer formation later, in silicon oxide film 11 is higher than that in silicon nitride film 12. With the above process, the structure shown in FIG. 1A is obtained.

Figure 1B:
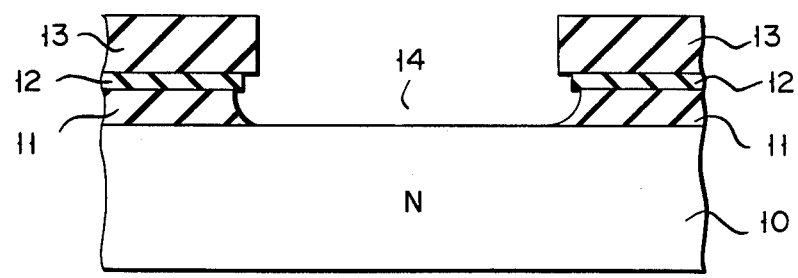

(2) A resist layer is formed on silicon nitride film 12. The resist layer is selectively etched by photoetching. Silicon nitride film 12 and silicon oxide film 11 are selectively etched using remaining resist layer 13 as a mask. Thus, opening 14 is formed to partially expose the major surface of silicon substrate 10. With the above process, the structure shown in FIG. 1B is obtained.

Figure 1C:
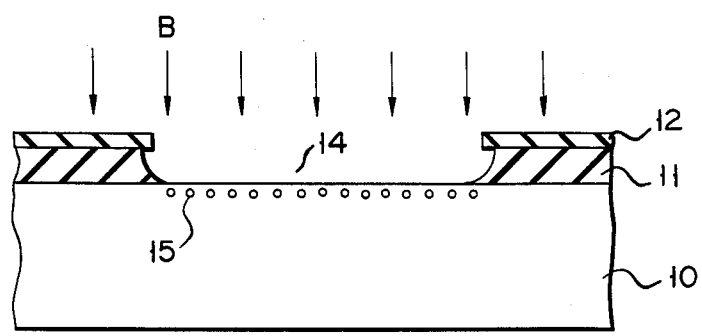

(3) Resist layer 13 is removed. Boron (B) ions are implanted in semiconductor substrate 10 at a dose of 6×15/cm$^2$ and at an acceleration energy of 40 keV using films 11 and 12 as a mask. Thus, the B ions are implanted in the exposed surface region of silicon substrate 10. With the above processes, the structure shown in FIG. 1C is obtained. In FIG. 1C, the B ions implanted in substrate 10 are indicated by reference numeral 15. The B ions are also left in films 11 and 12 serving as the mask.

Figure 1D:
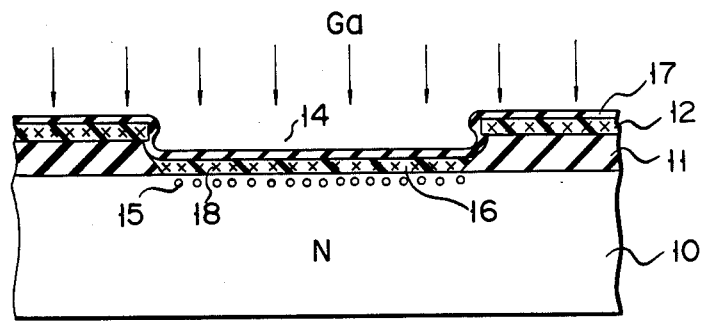

(4) Second silicon oxide film 16 of a thickness of about 100 nm is formed on the exposed surface portion of silicon substrate 10 by, e.g., thermal oxidation. Second silicon nitride film 17 of a thickness of about 20 nm is deposited on the entire surface of the resultant structure by the LP-CVD method. Gallium (Ga) ions are implanted at a dose of 6×10$^{14}$/cm$^2$ and at an acceleration energy of 10 keV. Upon ion-implantation, the Ga ions are left in second silicon oxide film 16 in opening 14, and in first silicon nitride film 12 in the mask portion. With the above process, the structure shown in FIG. 1D is obtained. In FIG. 1D, the Ga ions are illustrated as x.

Figure 1E:
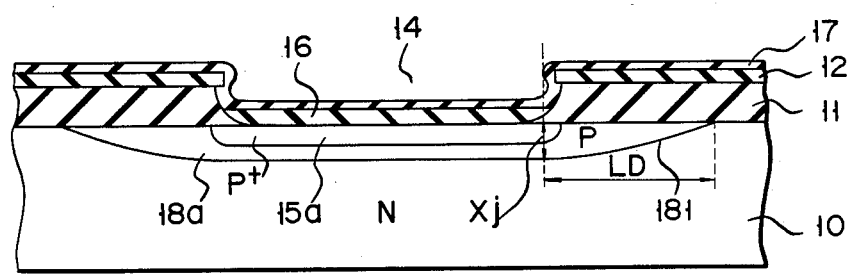

(5) The resultant structure is subjected to annealing in a nitrogen atmosphere at a temperature of 1,200° C. for 13 hours. As shown in FIG. 1E, p$^+$-type impurity layer 15a and p-type impurity layer 18a covering layer 15a are formed in silicon substrate 10 in a self-aligned manner. The impurity in layer 15a is boron 15, and the impurity in layer 18a is gallium 18.

Upon this diffusion, a Ga diffusion rate in the silicon substrate is higher than a B diffusion rate in the silicon substrate. The Ga diffusion rate in the silicon oxide film is two to 10 times the Ga diffusion rate in the silicon substrate. For this reason, while B ions are slowly diffused in silicon substrate 10 in the equi-directions, Ga ions are diffused fast in silicon oxide film 11 in the longitudinal and lateral directions. The Ga ions entering from silicon oxide film 11 to silicon substrate 10 are diffused faster than B ions. For this reason, the curvature of junction surface 181 of low-concentration impurity layer 18a is large. In addition, the B and Ga ions are implanted using films 11 and 12 as a mask. For this reason, low-concentration impurity layer (p-type impurity is Ga) 18a is formed to be self-aligned with high-concentration impurity layer (p-type impurity is B) 15a to surround it and to have a large curvature of junction surface 181. Note that Japanese Patent Disclosure (Kokai) No. 57-124427 discloses that when atoms in a silicon oxide film are diffused in a silicon substrate, a semiconductor layer having a large curvature can be obtained.

Diffusion depth xj of low-concentration impurity layer 18a actually formed as described above was 25 μm, and a surface concentration of high-concentration impurity layer 15a at this time was about 5×10$^{18}$ cm$^{-3}$. Lateral diffusion distance LD of low-concentration impurity layer 18a measured by the Spreading Resistance method was about 200 μm.

Note that B ions are present in first silicon oxide film 11. However, since the B diffusion rate in the silicon oxide film is lower than the Ga diffusion rate in the silicon oxide film, the B ions have almost no influence on formation of layers 15a and 18a. Since Ga ions present in silicon nitride films 12 and 17 have a low diffusion rate, they have almost no influence on formation of layers 15a and 18a.

Figure 1F:
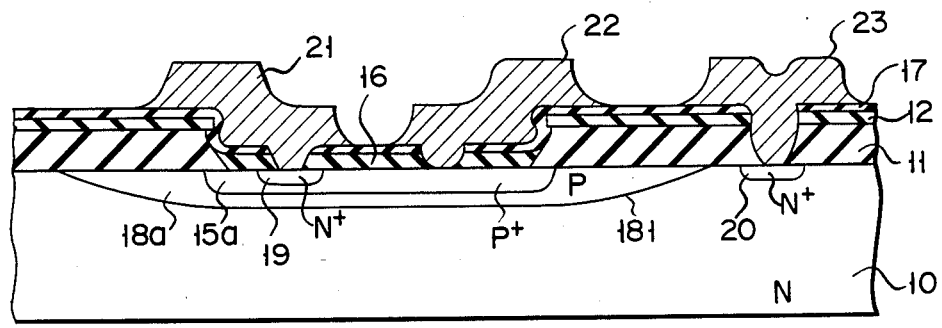

(6) N$^+$-type layer 19 serving as an emitter is formed in high-concentration impurity layer 15a by a known method. Similarly, n$^+$-type layer 20 is formed as a collector-contact portion in semiconductor substrate 10 serving as a collector. For example, aluminum is deposited on the entire surface of the resultant structure. The resultant aluminum layer is patterned to form emitter, base, and collector electrodes 21, 22, and 23. With the above process, an npn transistor shown in the sectional view of FIG. 1F and in the plan view of FIG. 2 is obtained. Note that FIG. 1F is a sectional view taken along line I—I in FIG. 2.

FIG. 3 shows the relationship between the film thickness of silicon oxide film 16 used for Ga diffusion and a degree of Ga diffusion in the lateral direction. As can be seen from FIG. 3, a diffusion ratio (LD/xj) is increased as the film thickness of silicon oxide film 16 used for diffusion is increased. Therefore, the shape of low-concentration impurity layer 18a can be controllled by changing the film thickness of second silicon oxide film 16.

FIG. 4 shows the results of breakdown voltage measurement of a p-n junction diode, constituted by low-concentration impurity layer 18a serving as a p-type base region and n-type silicon substrate 10 serving as a collector region, upon application of a voltage across base and collector electrodes 22 and 23 of the npn transistor (FIGS. 1F and 2) manufactured by the above-mentioned processes. More specifically, FIG. 4 shows comparison results of p-n junction breakdown voltages in the present invention and the guard ring method when the diffusion ratio is set to be 1, 4, 8, and 16 (in this embodiment, since lateral diffusion distance LD is 200 μm and diffusion depth xj is 25 μm, diffusion ratio LD/xj is 8).

As can be seen from FIG. 4, in this embodiment, a breakdown voltage about 90% of an ideal breakdown voltage (if the resistivity of an n-type silicon substrate is 60 Ωcm, 2100V) could be obtained, and the structure of this embodiment was superior to that obtained by the conventional guard ring method having a breakdown voltage about 80% of the ideal breakdown voltage. Thus, substantially the same breakdown voltage as that of the JTE method could be obtained. If the diffusion ratio is increased, the breakdown voltage can be improved. Therefore, if the diffusion ratio is increased within a range of a pellet area of a device, the breakdown voltage can be further improved.

As described above, in this embodiment, low-concentration impurity layer 18a can be formed by simple processes to be self-aligned with and to surround high-concentration impurity layer 15a. In addition, the curvature of the junction portion of low-concentration impurity layer 18a can be large. With this structure of this embodiment, a semiconductor device with a high breakdown voltage can be formed by simple processes to have a high yield.

In the above embodiment, after substrate 10 is exposed, B ions are implanted in substrate 10. However, the present invention is not limited to this. For example, after second oxide film 16 shown in FIG. 1D is formed, boron ions may be implanted in substrate 10 through film 16. In this case, the ion-implantation conditions are a dose of $4 \times 10^{14}$ cm$^{-2}$ and an acceleration energy of 10 keV.

In the above embodiment, after the surface of substrate 10 is exposed from opening 14, second silicon oxide film 16 is formed. However, the present invention is not limited to this. A structure substantially the same as the structure having the first and second oxide films may be directly obtained from the structure shown in FIG. 1A by partially decreasing the thickness of silicon oxide film 11 by appropriately selecting the etching conditions.

In the above embodiment, boron as a p-type impurity is used for forming high-concentration impurity layer 15a. If an n-type impurity, e.g., arsenic, is used in place of boron, n-type impurity layer 15a can be obtained. FIG. 5 shows the sectional structure of a transistor using arsenic instead of boron. In this case, since the diffusion rate of arsenic in silicon substrate 10 is lower than that of gallium in silicon substrate 10, the structure shown in FIG. 5 can be obtained. Therefore, an npn transistor having n-type impurity layer 15a doped with arsenic as an emitter, p-type impurity layer 18a doped with gallium as a base, and n-type silicon substrate 10 as a collector can be obtained.

An impurity implanted in second silicon oxide film 16 to form low-concentration impurity layer 18a is not limited to gallium. Atoms of any other element of a second conductivity type may be used if they have a higher diffusion rate in a silicon substrate than that of a first impurity in the silicon substrate and have a higher diffusion rate in the silicon oxide film than that in the silicon substrate. For example, aluminum (Al) may be used in place of gallium.

In the above embodiment, a silicon nitride film is used as an insulating film in which the diffusion rate of gallium becomes lower than that in the silicon oxide film. Instead, a silicon carbide (SiC) film may be used.

In the above embodiment, gallium (or aluminum) is doped using a mask. It is important for the present invention to dope gallium (or aluminum) in a silicon oxide film corresponding to a region in which boron ions are implanted. Therefore, upon formation of a relatively large element such as a power transistor, a spot size of an ion beam is decreased upon ion-implantation, so that the doping of gallium may be performed.

In the above embodiment, the case has been exemplified wherein an npn transistor is formed. However, the present invention is not limited to this. The present invention can be applied to semiconductor devices requiring a high-breakdown voltage, such as a diode, a high-breakdown voltage pnp transistor, a high-breakdown voltage MOS, and the like.

What is claimed is:

1. A method for manufacturing a semiconductor device, comprising steps of:
   forming a first silicon oxide film on a major surface of a silicon substrate of a first conductivity type;
   selectively etching said first silicon oxide film to form an opening;
   forming a second silicon oxide film on said silicon substrate through said opening;
   doping, before or after the step of forming said second silicon oxide film, a first impurity in a portion of said silicon substrate opposing said opening using said first silicon oxide film as a mask;
   doping, into said second silicon, oxide film, a second impurity of a second conductivity type, a diffusion rate of which in said silicon substrate is higher than that of said first impurity in said silicon substrate, and a diffusion rate of which in said first silicon oxide film is higher than that in said silicon substrate; and
   diffusing said first impurity and said second impurity of the second conductivity type into said silicon substrate to form, in said silicon substrate, a first layer and a second layer of the second conductivity type surrounding said first layer.

2. A method according to claim 1, wherein said first impurity comprises at least one of boron (B) and arsenic (As).

3. A method according to claim 1, wherein said second impurity comprises at least one of gallium (Ga) and aluminum (Al).

4. A method according to claim 1, wherein at least one of the steps of doping said first impurity into said silicon substrate and the step of doping said second impurity into said second silicon oxide film comprises a step of ion-implantation.

5. A method according to claim 1, wherein said method further has a step of forming, on said first silicon oxide film, an insulating film in which a diffusion rate of said second impurity is lower than that of said second impurity in said silicon oxide film, the step of forming said opening comprises a step of etching said first silicon oxide film and said insulating film, and the step of doping said second impurity comprises a step of doping said second impurity into said second silicon oxide film and said insulating film.

6. A method according to claim 5, wherein said insulating film comprises at least one of a silicon nitride (SiN$_3$) film and a silicon carbide (SiC) film.

7. A method according to claim 1, wherein
   said first impurity comprises boron (B),
   said second impurity comprises at least one of gallium (As) and aluminum (A(), and
   said method further comprises a step of forming a region of the first conductivity type in said first layer.

8. A method according to claim 1, wherein
   the step of forming said first silicon oxide film further comprises a step of forming an insulating film comprising at least one of a silicon nitride film and a silicon carbide film on said first silicon oxide film,
   the step of forming said second silicon oxide film comprises a step of forming a silicon oxide film having a smaller thickness than that of said first silicon oxide film,
   the step of doping said first impurity comprises a step of ion-implanting said first impurity into said silicon substrate using said first silicon oxide film and said insulating film as a mask, and
   the step of doping said second impurity comprises a step of ion-implanting said second impurity into said second silicon oxide film using said insulating film as a mask.

9. A method for manufacturing a semiconductor device, comprising:
   a step of forming an insulating film on one major surface of a semiconductor substrate;
   a step, performed at least one of before and after the step of forming said insulating film, of doping a first impurity into a predetermined surface region of said substrate;
   a step of ion-implanting, into a portion of said insulating film facing said predetermined surface region, a second impurity, a diffusion rate of which in said semiconductor substrate is higher than that of said first impurity in said semiconductor substrate, and a diffusion rate of which in said insulating film is higher than that in said semiconductor substrate; and
   a step of diffusing said first impurity and said second impurity of the second conductivity type to form, in a surface region of said semiconductor substrate, a first layer containing said first impurity and a second layer containing said second impurity and surrounding said first layer.

10. A method according to claim 9, wherein
   the step of forming said insulating film comprises:
   a step of forming a first silicon oxide film on a major surface of a silicon substrate of the first conductivity type;
   a step of selectively etching said first silicon oxide film to form an opening; and
   a step of forming a second silicon oxide film on said silicon substrate through said opening,
   the step of doping said first impurity comprises a step, performed at least one of before and after the step of forming said second silicon oxide film, of doping said first impurity into a portion of said silicon substrate opposing said opening using said first silicon oxide film as a mask, and
   the step of doping said second impurity comprises a step of doping said second impurity into said second silicon oxide film.

11. A method of manufacturing a semiconductor device, comprising:
   a step of forming a first silicon oxide film on a major surface of an n-type silicon substrate;
   a step of forming an insulating film comprising one of a silicon nitride film and a silicon carbide film on said first silicon oxide film;
   a step of selectively etching said first silicon oxide film and said insulating film to form an opening;
   a step of forming a second silicon oxide film on said silicon substrate exposed by said opening;
   a step, performed at least one of before and after the step of forming said second silicon oxide film, of ion-implanting a first impurity comprising at least one of boron and arsenic into a portion of said silicon substrate opposing said opening using said first silicon oxide film and said insulating film as a mask;
   a step of ion-implanting a second impurity of a second conductivity type comprising at least one of gallium and aluminum into said second silicon oxide film using said insulating film as a mask; and
   the step of simultaneously diffusing said first impurity and said second impurity into said silicon substrate to form, in said substrate, a first layer and a p-type second layer surrounding said first layer in a self-aligned manner.

* * * * *